(12) United States Patent
Chu

(10) Patent No.: US 8,910,822 B2
(45) Date of Patent: Dec. 16, 2014

(54) METHOD OF FORMING SEALED ENCLOSURE

(75) Inventor: Man Yin Arthur Newton Chu, Aberdeen (HK)

(73) Assignee: Defond Components Limited, Chai Wan, Hong Kong SAR (CN)

(*) Notice: Subject to any disclaimer, the term of this patent is extended or adjusted under 35 U.S.C. 154(b) by 562 days.

(21) Appl. No.: 13/094,876

(22) Filed: Apr. 27, 2011

(65) Prior Publication Data

US 2011/0266282 A1 Nov. 3, 2011

Related U.S. Application Data

(60) Provisional application No. 61/329,143, filed on Apr. 29, 2010.

(51) Int. Cl.
| | | |
|---|---|---|
| *F21V 15/01* | (2006.01) | |
| *H05K 5/06* | (2006.01) | |
| *F21V 31/00* | (2006.01) | |
| *F21V 15/015* | (2006.01) | |
| *F21Y 101/02* | (2006.01) | |

(52) U.S. Cl.
CPC ............. *H05K 5/06* (2013.01); *F21V 31/005* (2013.01); *F21V 15/011* (2013.01); *F21V 15/013* (2013.01); *F21V 15/015* (2013.01); *F21Y 2101/02* (2013.01)
USPC ..................................... 220/526; 362/217.01

(58) Field of Classification Search
USPC ............ 220/526, 621, 361; 362/154, 217.01, 362/362, 367, 374, 375, 158; 29/450, 428; 277/644, 648, 649, 906; 49/91.1, 49/489.1, 506
See application file for complete search history.

(56) References Cited

U.S. PATENT DOCUMENTS

| | | | | |
|---|---|---|---|---|
| 1,974,638 | A * | 9/1934 | Axe .............................. | 49/489.1 |
| 5,001,613 | A * | 3/1991 | Foster et al. .................. | 362/223 |
| 5,791,764 | A * | 8/1998 | Jaksich ......................... | 362/222 |
| 6,185,807 | B1 * | 2/2001 | Kazmierczak et al. ......... | 29/450 |
| 6,805,470 | B1 * | 10/2004 | Ward ............................ | 362/374 |
| 7,244,058 | B2 * | 7/2007 | DiPenti et al. ................ | 362/547 |
| 8,142,047 | B2 * | 3/2012 | Acampora et al. ....... | 362/217.01 |
| 8,142,048 | B2 * | 3/2012 | Risley, Sr. ................ | 362/217.1 |
| 8,186,847 | B2 * | 5/2012 | Hu et al. ....................... | 362/225 |
| 2007/0058377 | A1 * | 3/2007 | Zampini et al. ............... | 362/372 |
| 2010/0220469 | A1 * | 9/2010 | Ivey et al. .................... | 362/218 |

* cited by examiner

*Primary Examiner* — Fenn Mathew
*Assistant Examiner* — Robert Stodola
(74) *Attorney, Agent, or Firm* — Leydig, Voit & Mayer, Ltd.

(57) ABSTRACT

A method of sealing a first part to a second part of an enclosure. The first part is a metal extrusion having a channel-shaped cross-section and the second part is a light-transmissive plate, together forming the enclosure. An electrical light source located in the enclosure shines light through the light-transmissive plate. The sealing method includes placing an elongate seal member into a groove of a first part of the enclosure, extending along the groove, and inserting an edge of a second part of the enclosure into the groove of the first part.

5 Claims, 18 Drawing Sheets

METHOD OF FORMING SEALED ENCLOSURE

The present invention relates to a method and apparatus relating to weather-proof sealing for an enclosure and in particular, but not exclusively, for a casing for LED lighting.

BACKGROUND OF THE INVENTION

Outdoor lighting apparatus require use of a weather-proof casing or housing that can block against ingress of water from rain or moisture in the atmosphere, and any other unwanted matter such as dust or insects. Weather-proof protection often involves the use of seals in the form of, for example, o-rings and gaskets. O-rings are only applicable to situations where the engagements concern a circular arrangement, and gaskets to planar engagements. Linear seals are relatively less common. In all cases, application of seals in confined spaces is not straight forward.

The invention seeks to mitigate or to at least alleviate such problem or shortcoming by providing a new or otherwise improved method of sealing an enclosure and an enclosure employing the method.

SUMMARY OF THE INVENTION

According to a first aspect of the invention, there is provided a method of sealing a first part to a second part of an enclosure, comprising the steps of:

(a) providing an enclosure having at least said first and second part, the first part having a groove into which an edge of the second part is to engage;

(b) providing an elongate seal member of a resiliently deformable material;

(c) placing the seal member into the groove of the first part such that the seal member extends along the groove; and (d) engaging the edge of the second part into the groove of the first part.

Preferably, step (c) includes placing the seal member laterally into the groove of the first part In a preferred embodiment, step (c) precedes step (d).

More preferably, the second part is resiliently bendable to a limited extent, and step (d) includes bending the second part to reduce its size slightly in order to permit engagement of its edge into the groove of the first part.

Further more preferably, the second part has opposite first and second ends, and step (d) is performed from the first end to the second end of the second part, in a direction along the groove.

It is preferred that the groove has a base, and the seal member expands and is squeezed between the base of the groove and the edge of the second part.

It is preferred that the first part has on opposite sides thereof two said grooves facing each other, and the second part has on opposite sides thereof two said edges for engagement and sealing with the grooves respectively, and steps (c) and (d) are sequentially performed for the edge and groove of a second pair while the edge and groove of the first pair are in engagement.

Optionally, step (c) includes stretching the seal member along its length to reduce its cross-sectional size, and the method includes, subsequent to step (d), step (e) of releasing the seal member from stretching such that it expands in cross-sectional size and seals with the edge and the groove.

In a preferred embodiment, step (d) precedes step (c).

More preferably, the second part is rigid.

It is preferred that the groove has opposite sides, and the seal member expands and is squeezed between one side of the groove and an adjacent side of the edge of the second part.

It is further preferred that said adjacent side of the edge of the second part has a reduced thickness by presence of a step which accommodates at least part of the thickness of the seal member.

Preferably, the first part has on opposite sides thereof two said grooves facing each other, and the second part has on opposite sides thereof two said edges for engagement and sealing with the grooves respectively, and steps (d), (c) and (e) are sequentially performed for each pair of the edge and groove.

More preferably, step (d) comprises sliding the second part along the first part in the direction of the grooves, thereby simultaneously engaging both edges into the respective grooves.

In a preferred embodiment, the first part has a pair of left and right side walls on a base together forming a hollow structure having an opening opposite the base, each side wall having at the opening a said groove facing the other groove, and the second part extends across the opening to close the enclosure, the second part being wider than the opening.

According to a second aspect of the invention, there is provided an enclosure comprising:

a first part having a groove;
a second part having an edge engaged within the groove; and
an elongate seal member of a resiliently deformable material in and extending along the groove;
wherein the seal member in the groove is laterally compressed between the groove and the edge, thereby providing a sealing engagement between the first part and the second part.

Preferably, the groove has a base, and the seal member is squeezed between the base of the groove and the edge of the second part.

More preferably, the seal member is placed into the groove, and then the edge of the second part is engaged into the groove and compresses the seal member.

Optionally, the seal member is stretched along its length to have a reduced cross-sectional size, and is later released from stretching such that it expands in cross-sectional size and seals with the edge and the groove.

In a preferred embodiment, the first part has a pair of left and right side walls on a base together forming a hollow structure having an opening opposite the base, each side wall having at the opening a said groove facing the other groove, and the second part extends across the opening to close the enclosure, the second part being wider than the opening.

In a specific construction, the first part comprises a metal extrusion of a channel-shaped cross-section and the second part comprises a light-transmissive panel, with an electrical light source located in the enclosure for shinning light out through the light-transmissive panel.

BRIEF DESCRIPTION OF DRAWINGS

The invention will now be more particularly described, by way of example only, with reference to the accompanying drawings, in which:

FIG. 3A is an enlarged cross-sectional end view of the channel and seal member of FIG. 3;

FIG. 4A is an enlarged cross-sectional end view of the channel and seal members of FIG. 4;

FIG. 5A is an enlarged cross-sectional end view of the assembly of FIG. 5;

FIG. 6A is a side view of the assembly of FIG. 6;

FIG. 6B is an enlarged cross-sectional end view of the assembly of FIG. 6;

FIG. 7A is a side view of the assembly of FIG. 7;

FIG. 7B is an enlarged cross-sectional end view of the assembly of FIG. 7;

FIG. 8A is an enlarged cross-sectional end view of the assembly of FIG. 8;

FIG. 9A is an enlarged cross-sectional end view of the assembly of FIG. 9;

FIG. 10A is an enlarged perspective view of part of the assembly of FIG. 10;

FIG. 11A is an enlarged perspective view of part of the assembly of FIG. 11;

FIG. 12A is an enlarged cross-sectional end view of the channel and cover, completely engaged, of FIG. 12;

FIG. 13A is an enlarged cross-sectional end view of the assembly of FIG. 13;

FIG. 14A is an enlarged cross-sectional end view of the assembly of FIG. 14;

DETAILED DESCRIPTION OF PREFERRED EMBODIMENTS

Figure 1:
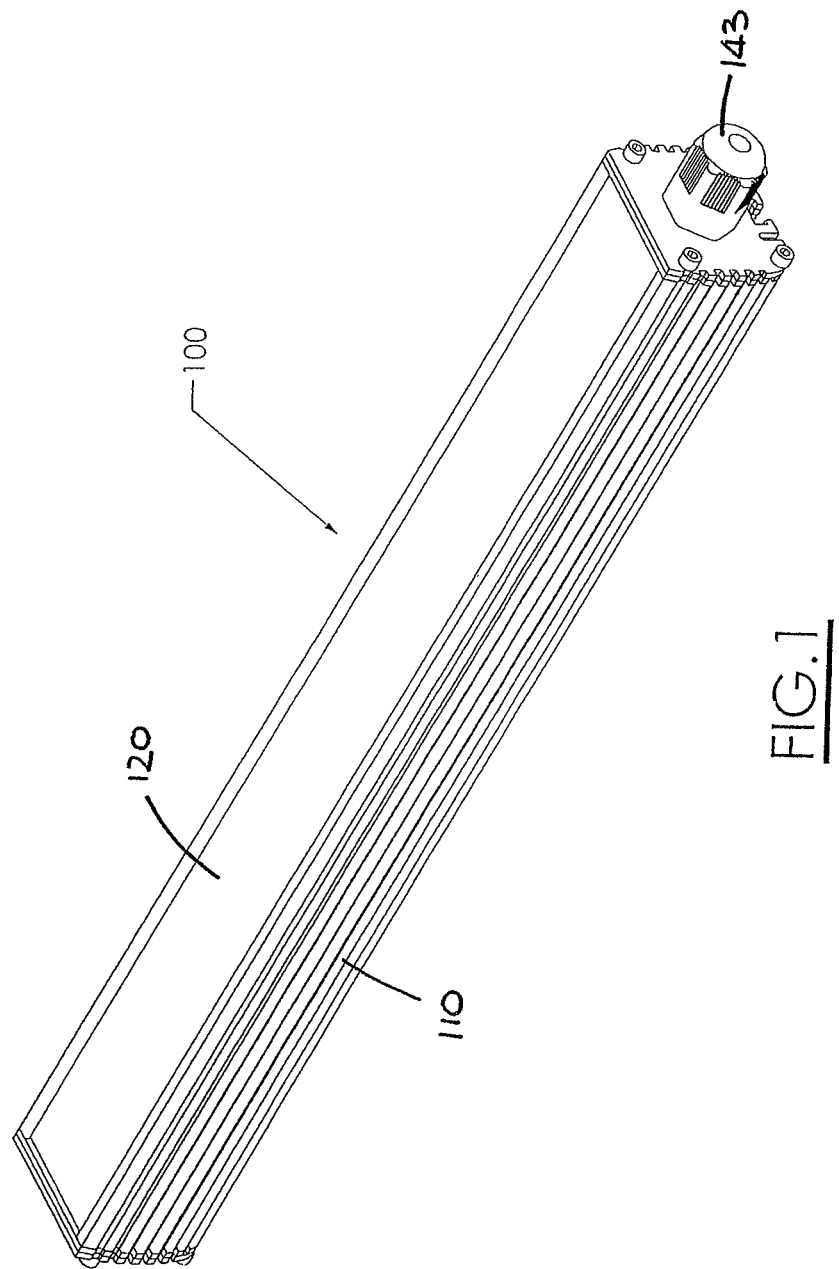
FIG. 1 is a perspective view of a first embodiment of an enclosure employing a method of sealing in accordance with the invention.
Figure 2:
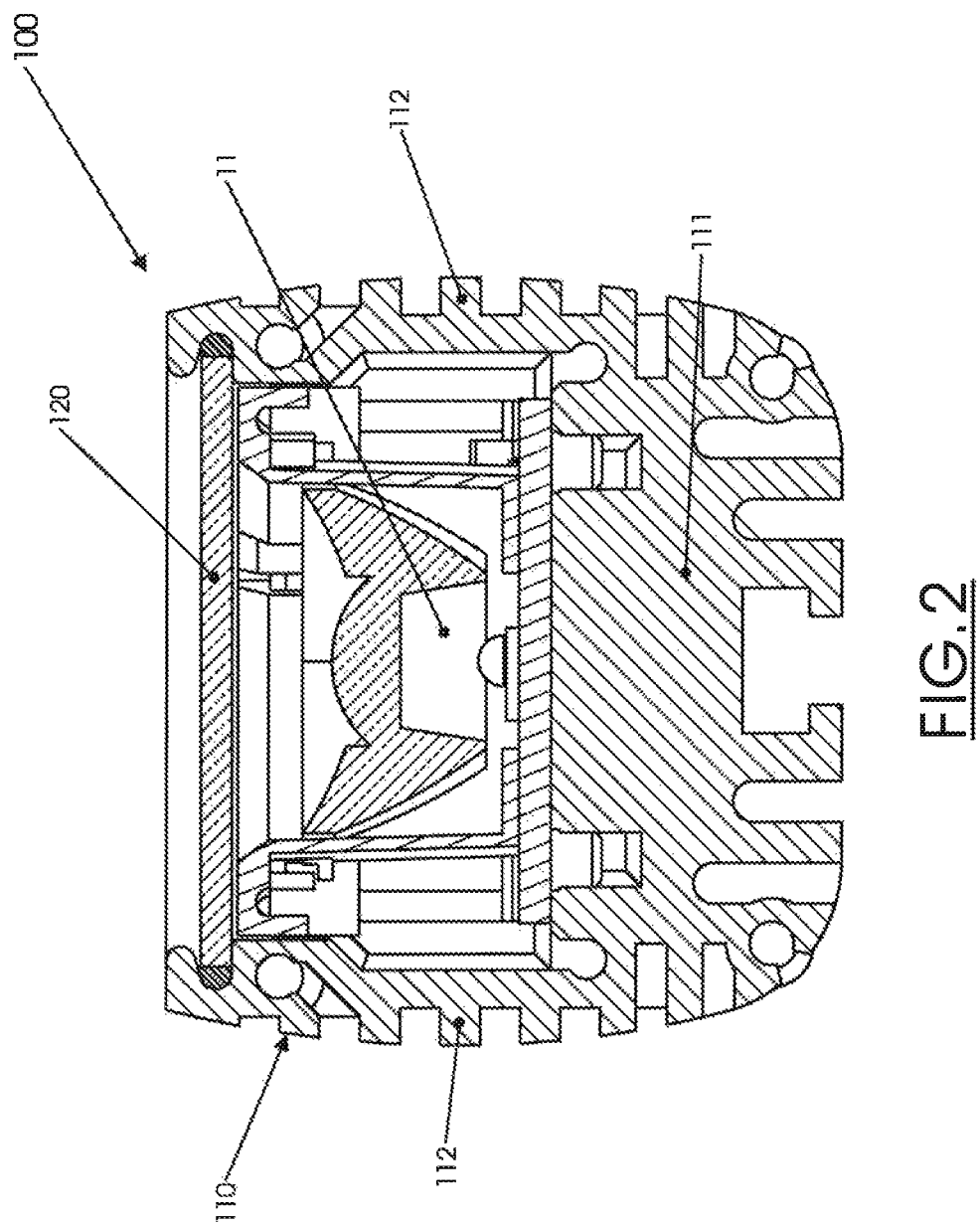
FIG. 2 is an enlarged cross-sectional end view of the enclosure of FIG. 1.
Figure 3:
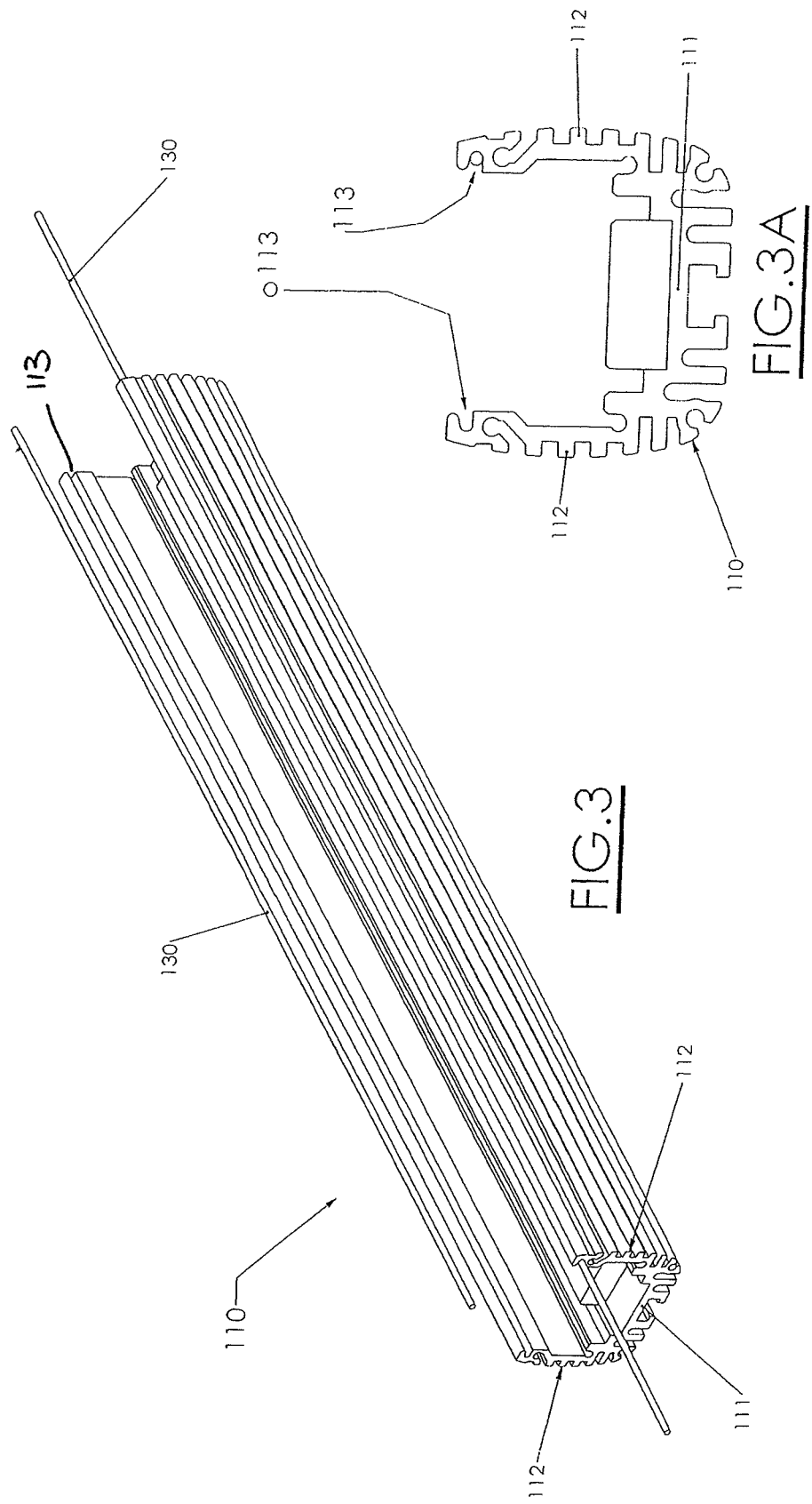
FIG. 3 is a perspective view of a channel and two seal members of the enclosure of FIG. 1, showing the channel being fitted with one of the seal members.
Figure 4:
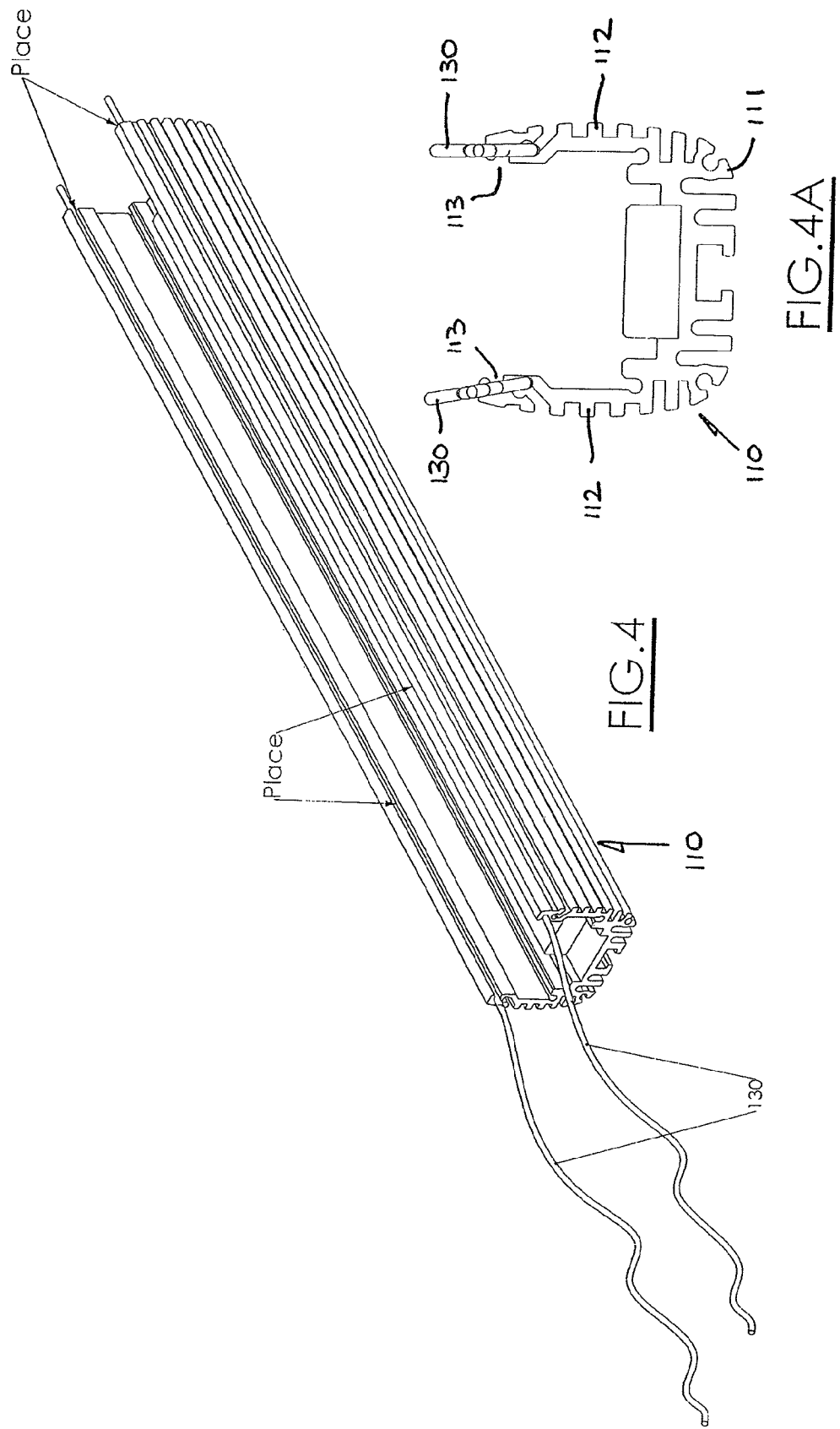
FIG. 4 is a perspective view of the channel and seal members of FIG. 3, showing the channel being fitted with both seal members.

Referring initially to FIGS. 1 to 11A of the drawings, there is shown a first enclosure in the form of casing 100 employing a method of sealing, both embodying the invention, in which a row of LEDs 10 each with an associated lens 11 and a common electrical drive circuit are mounted, together constituting an LED lamp or light bar. The casing 100 is constructed and sealed to meet a certain weather-proof standard such that the LED lamp is suitable for outdoor use.

The casing 100, having an oblong shape, is formed by a metal channel 110 made from a section of an aluminium extrusion of a generally square channel-shaped cross-section, and a front cover 120 that closes an upper open side of the channel 110. The cover 120 is provided by a plastic panel made of polycarbonate for example. The cover 120 is light-transmissive or indeed transparent such that light from the LEDs 10 pre-installed inside can be shone out through the cover 120 for illumination. The cover 120 is resiliently bendable to a certain extent, by virtue of its material being polycarbonate or the like.

The channel 100 has a base 111 and a pair of left and right side walls 112 on opposite sides thereof, together being an integral hollow structure having an opening opposite the base 111. With cooling fins all over its outer surface and co-extending along its length, the channel 100 also acts as a heat sink for dissipating heat generated by the electrical drive circuit in operation.

Near the outer edges at the channel's opening, the left and right side walls 112 are formed on their inner surfaces with a pair of opposed grooves 113 that run along the length of the channel 100. The cover 120 extends across the opening between the two side walls 112 thereby closing the casing 100, with its opposite left and right edges 122 in sealing engagement with the grooves 113 respectively. The cover 120 is wider than the opening.

The sealing engagement between each of the edges 122 and the corresponding groove 113 is weather proof. The seal is established through the use of an elongate seal member 130 on each side, which is made of a resiliently deformable material such as rubber, according to the sealing method of the subject invention.

In addition to the provision of the relevant hardware components and parts as described above, the sealing method includes the following two steps:

(i) Placing the seal members 130 laterally into the two grooves 113 on the side walls 112 of the channel 110 respectively, such that each seal member 130 extends along the length of the corresponding groove 113, and (ii) Stretching each of the two seal members 130 along its length to reduce its cross-sectional size.

Steps (i) and (ii) are illustrated in FIGS. 3, 3A, 4 and 4A, which show a stretched seal member 130 in each groove 113. These two steps can be performed in the order as stated, or in the reverse order.

It is important to note herein that step (ii) is optional and may be omitted in a slightly different version of the sealing method. In the absence of step (ii), the seal members 130 are simply left unstretched or at rest in the corresponding grooves 113.

Figure 5:
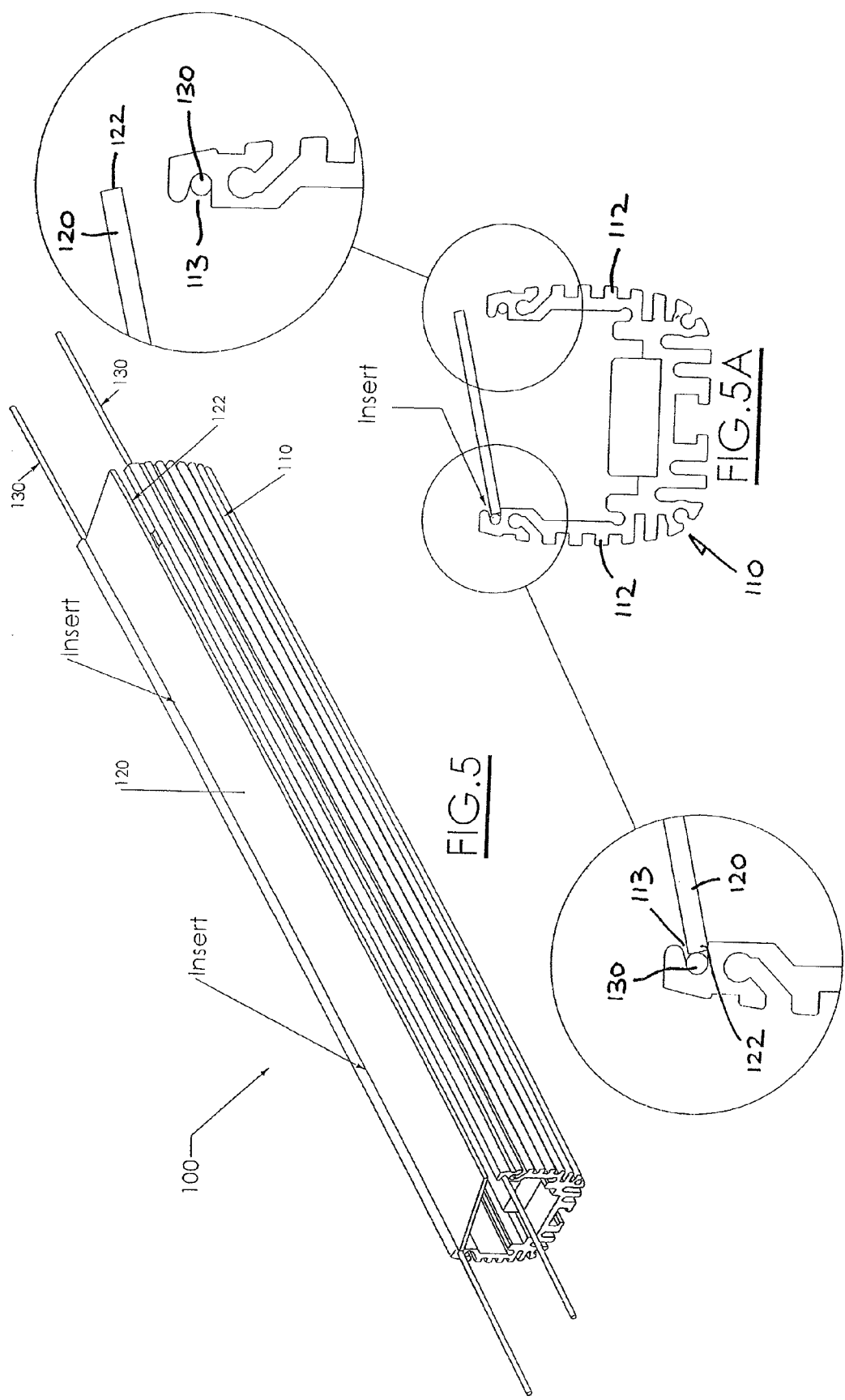
FIG. 5 is a perspective view of the channel and seal members of FIG. 4, showing also a cover being engaged with the channel.
Figure 6:
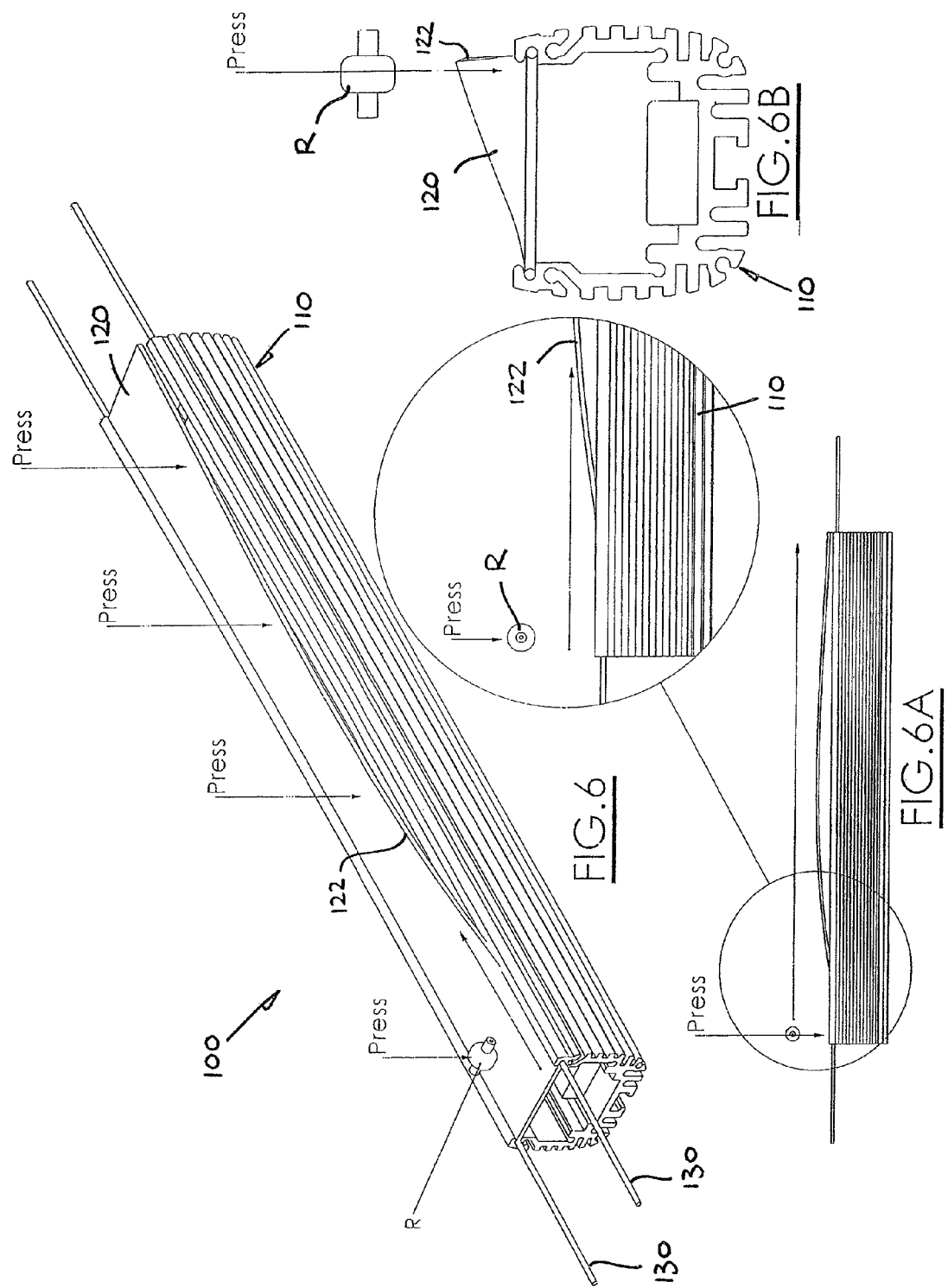
FIG. 6 is a perspective view of the assembly of FIG. 5, showing the cover being engaged with the channel by a press roller.
Figure 7:
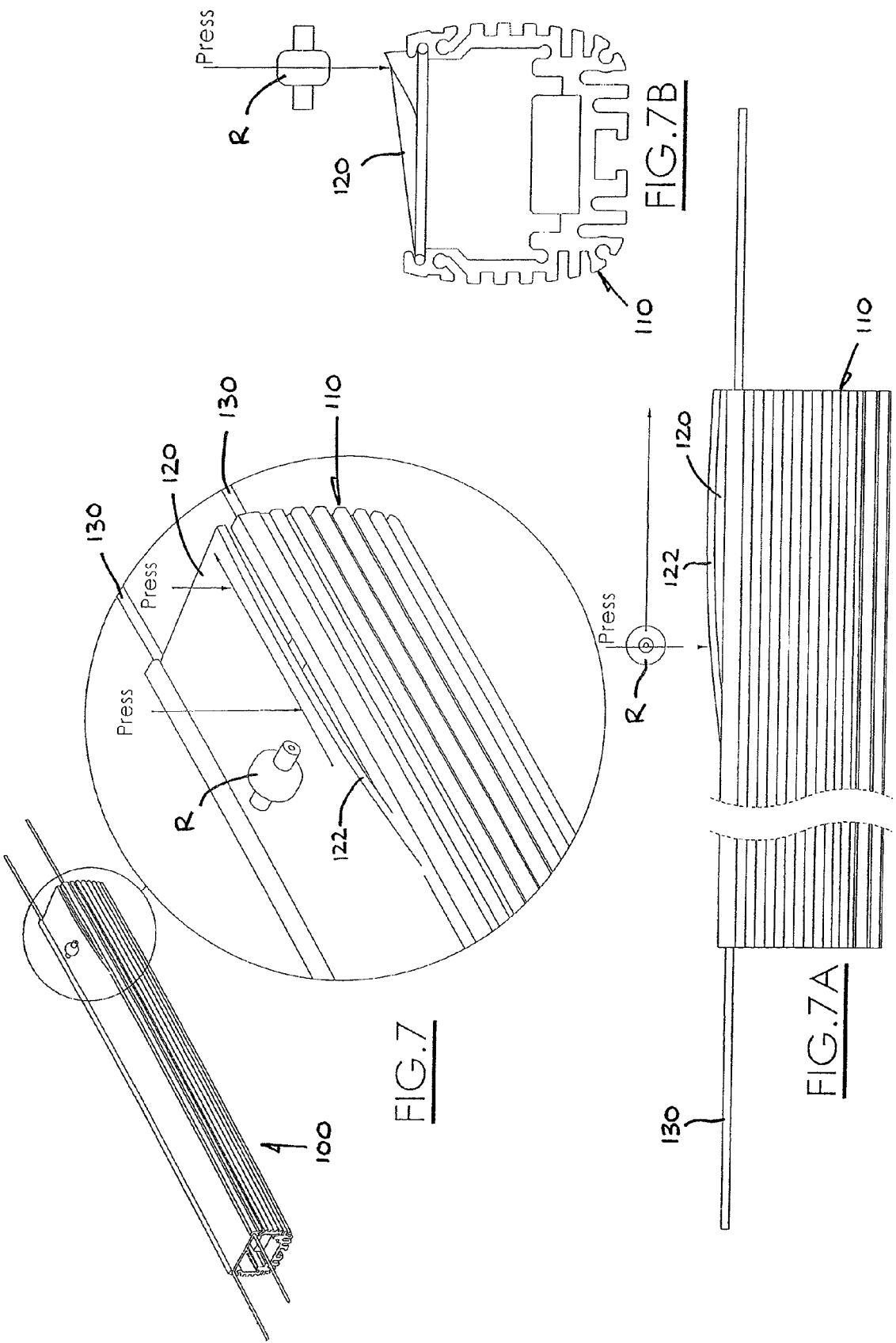
FIG. 7 is a perspective view of the assembly of FIG. 6, showing the cover being almost completely engaged with the channel.

The sealing method includes the following two further steps which take place subsequently in the order as stated, while the two seal members 130 are being stretched:

(iii) engaging one edge 122 of the cover 120 into the groove 113 of the channel 110 on same first side, such as the left side, as illustrated in FIGS. 5 and 5A, and (iv) engaging the other edge 122 of the cover 120 into the groove 113 of the channel 110 on the second right side, as illustrated in FIGS. 6, 6A, 7 and 7A.

Step (iii) involves simply inserting the left side edge 122 laterally straight into the left side groove 113. Step (iii) is performed first and then followed by step (iv) to the edge 122 and groove 113 of the second pair on the right side, while the edge 122 and groove 113 of the first pair on the left side are in engagement.

The gap across the opening of the channel 110 is marginally not sufficiently wide to accept the width of the cover 120, unless the cover 120 is twisted or bent to slightly reduce its lateral size i.e. width. Thus, according to this particular embodiment of the sealing method, in step (iv), in order to engage the cover 120 into the channel 110, it is necessary to press the cover 120 to twist or bend it to slightly reduce its width in order to press it into the channel's opening to thereby permit engaging of the remaining edge 122 into the associated groove 113.

While this is being done, the channel 110 may be expanded or widened marginally, but the extent is only minimal and in practice is barely noticeable.

In particular, step (iv) involves a downward pressing action upon the cover 120 to squeeze the cover 120 into the opening of the channel 110, until the right side edge 122 of the cover 120 also enters into the opening and engages with the groove 113 on the same side. This takes place at where the pressing action is applied, as conveniently applied by a press roller R as shown in FIGS. 6, 6A, 7 and 7A.

More specifically, the press roller R is driven, while pressing down, to travel from one end of the cover 120 to the opposite end in a direction along the groove 113, thereby squeezing the cover 120 into the channel 110 and engaging the former's edge 122 with the latter's groove 113 gradually along the length of the cover 120. This is illustrated from FIGS. 6 and 6A to FIGS. 7 and 7A.

Figure 8:
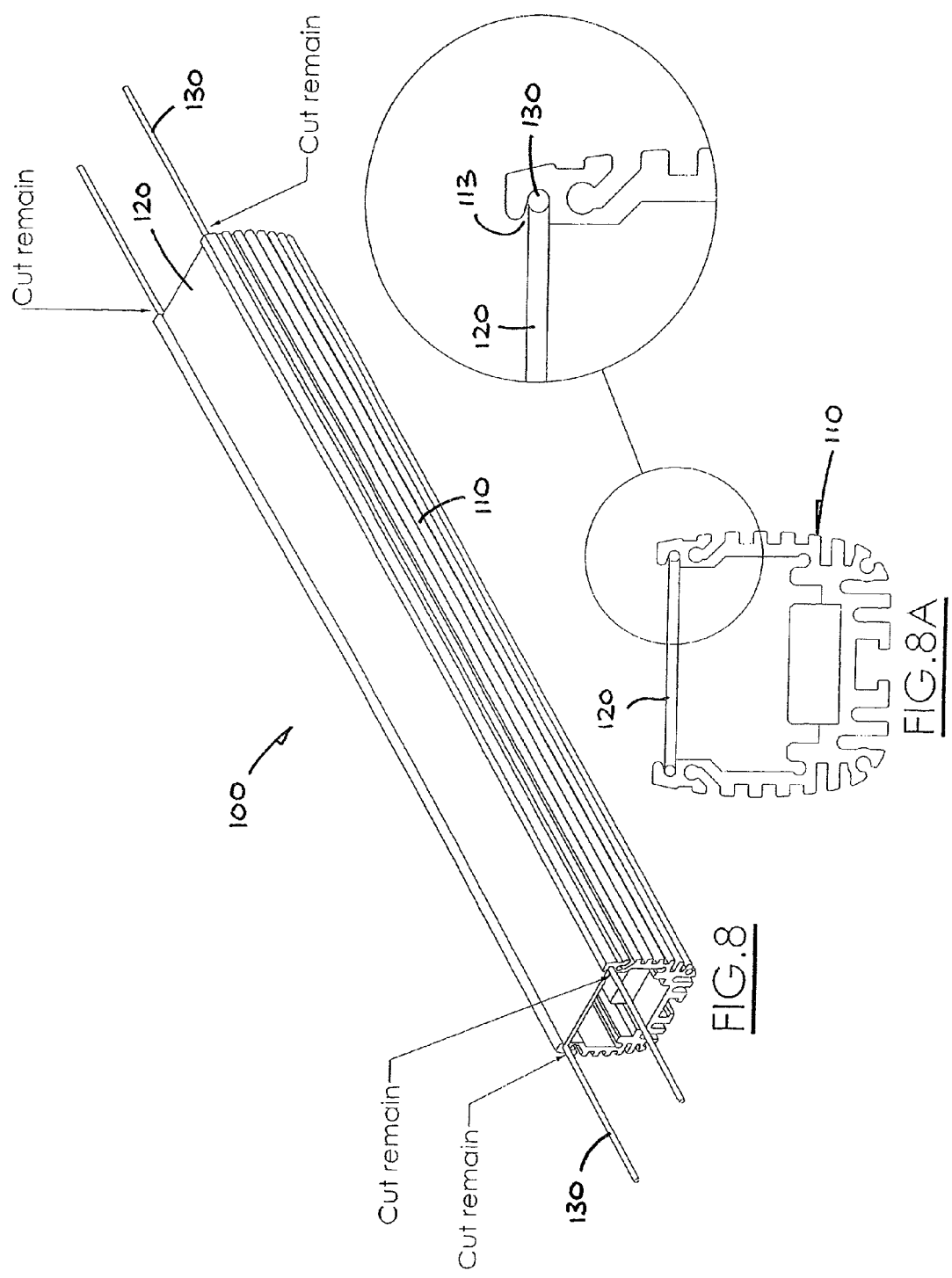
FIG. 8 is a perspective view of the assembly of FIG. 7, showing the cover engaged with the channel and the seal members.
Figure 9:
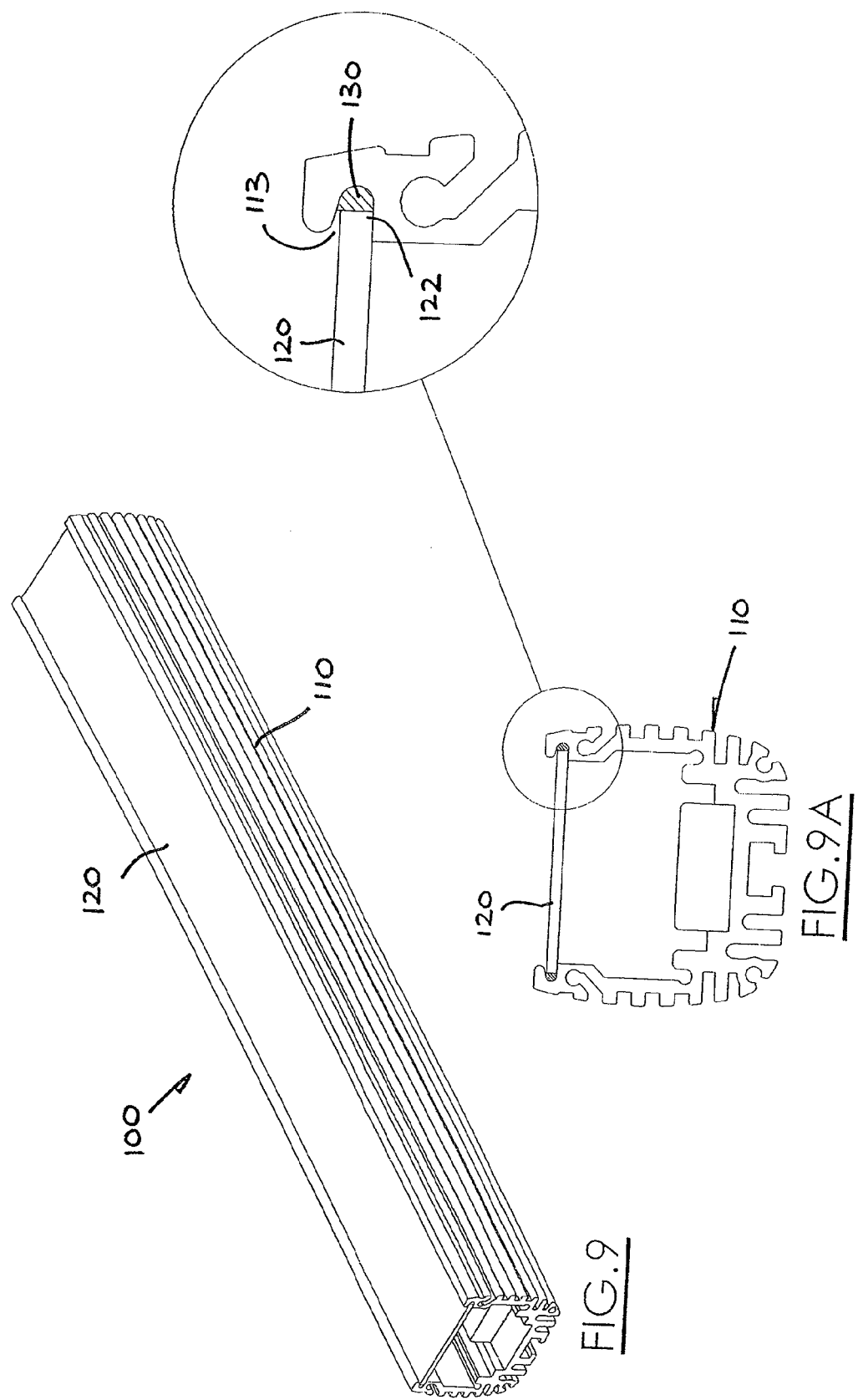
FIG. 9 is a perspective view of the assembly of FIG. 8, showing the seal members sealing.
Figure 10:
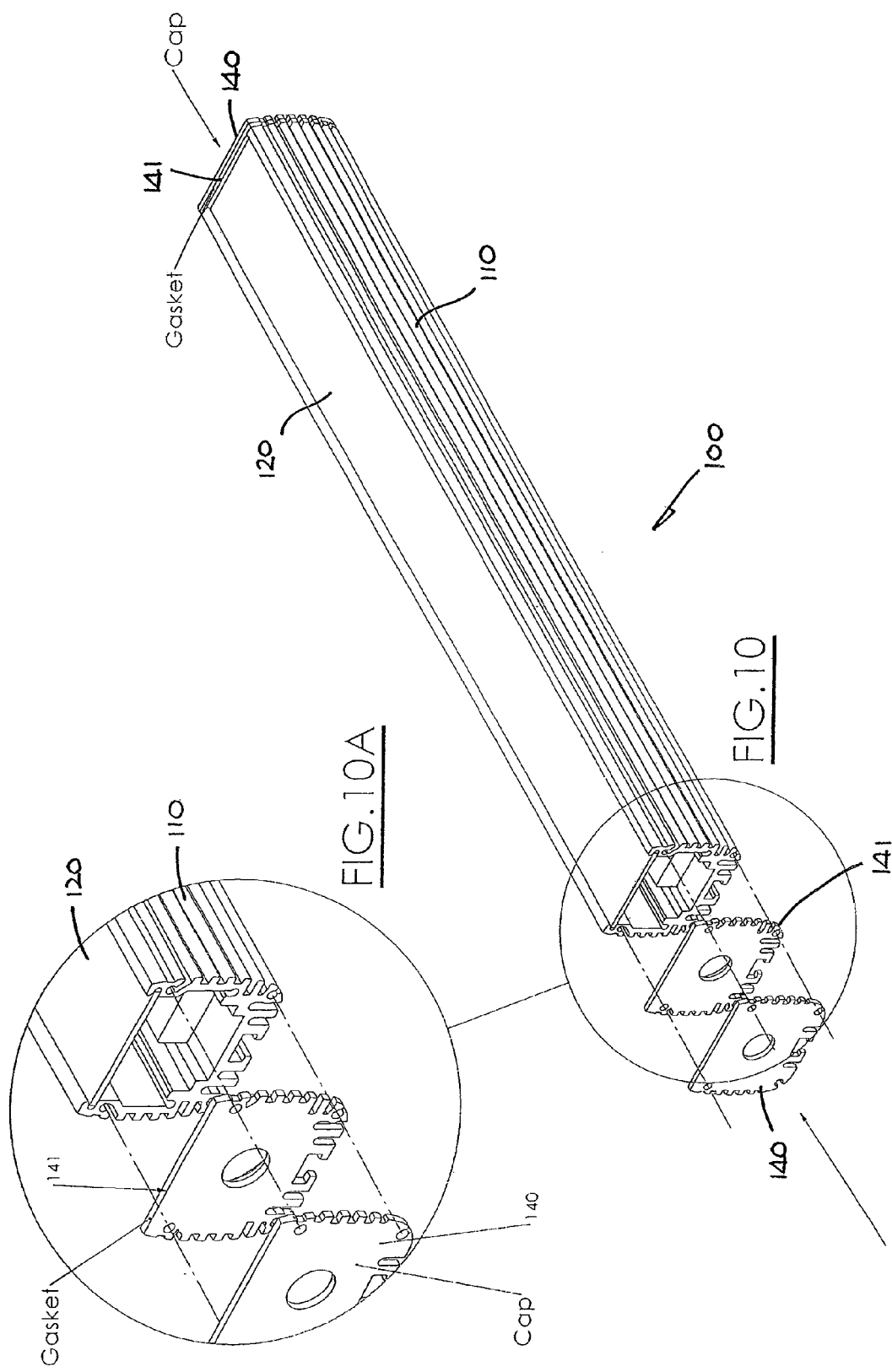
FIG. 10 is a perspective view of the assembly of FIG. 9, showing also an end plate with gasket sealing off each end of the assembled channel and cover.
Figure 11:
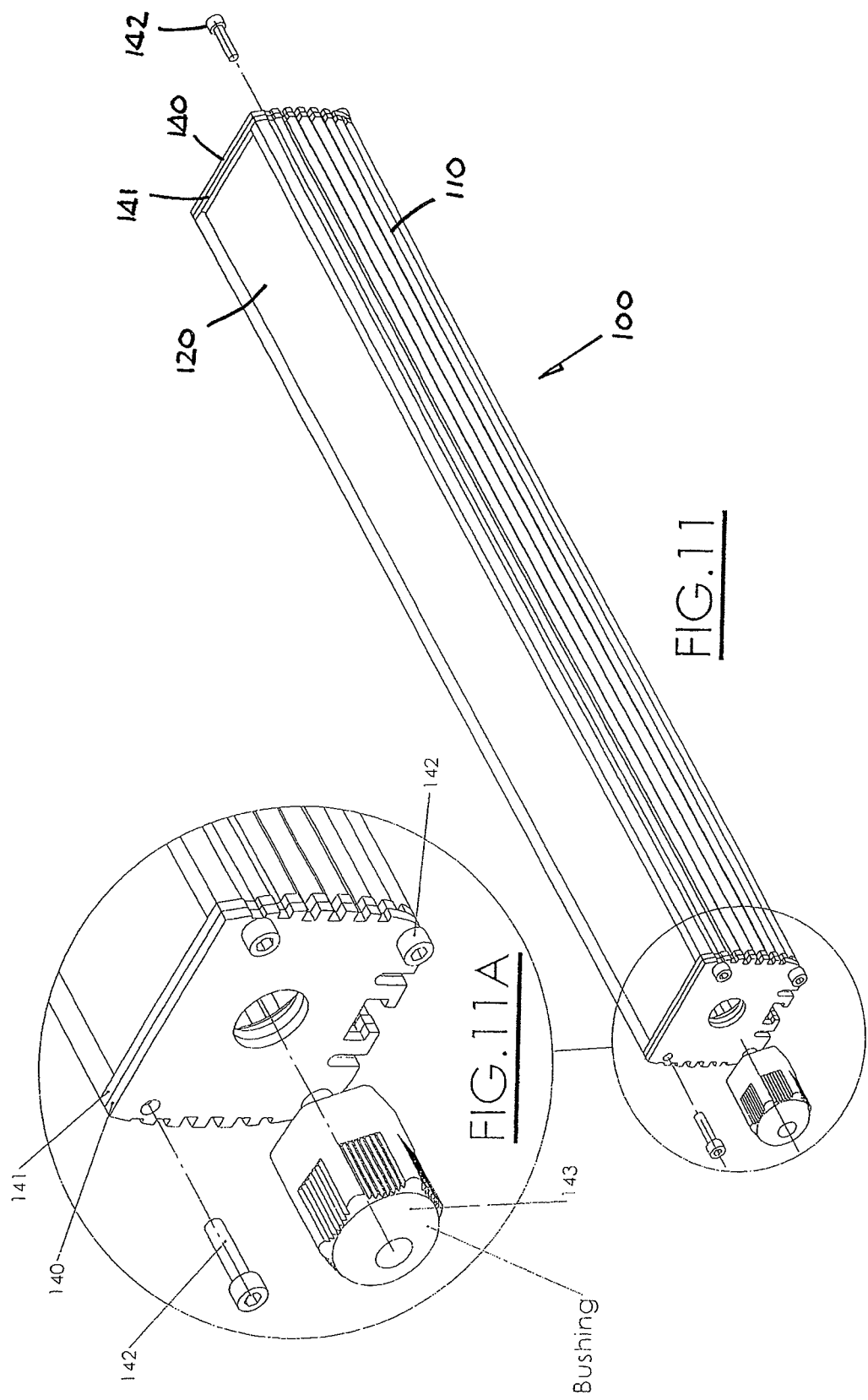
FIG. 11 is a perspective view of the assembly of FIG. 10, showing the end plate and gasket being secured by screws and also a bushing being attached.

As a further step (v) illustrated in FIGS. 8 and 8A, each of the two seal members 130 is released from being stretched such that it expands in cross-sectional size and seals with the edge 122 and the groove 113 on the same, each side of the channel 110 and cover 120. Opposite ends of the seal members 130, which remain extending from either end of the channel 110, are then cut. The sealing engagement on each side is established as shown in FIG. 9 and more clearly in FIG. 9A.

The enlarged detail of FIG. 9A shows that the space in the groove 113 between the edge 122 and the base of the groove 113 (which has a base flanked by two opposite sides) is substantially completely taken up by the seal member 130, which remains squeezed and compressed in the space confined to provide the intended degree or force of sealing, for example as required for outdoor weather-proof protection.

It is important to note herein that step (v) is not necessary, nor can it be performed, if step (ii) has been omitted earlier in the simplified sealing method. In the absence of steps (ii) and (v), the seal members 130 are compressed only when the cover 120 is squeezed into the opening of the channel 110 and its edges 122 engaged with the groove 113 on opposite sides. The seal members 130 are only subject to compression laterally, without there being any self expansion upon release if they were pre-stretched, to seal with the corresponding edges 122 and grooves 113. This normally provides a tighter sealing engagement between the cover 120 and the channel 110 (FIGS. 9 and 9A), generally dependent upon their relative dimensions.

Each of opposite ends of the channel 110 with the cover 120 attached is finally sealed off by a respective end cap or plate 140 with a gasket 141 secured by screws 142, and then a bushing 143 is attached for connection of an electrical cable to the drive circuit inside, as illustrated in FIGS. 10, 10A, 11 and 11A.

Referring now to FIGS. 12 to 18 of the drawings, there is shown a second enclosure in the form of casing 100A employing another method of sealing, both embodying the invention, which likewise houses a row of LEDs each with an associated lens and a common electrical drive circuit, together constituting another LED lamp or light bar. The second casing 100A has a similar construction as the first casing 100 described above, except otherwise stated, with equivalent components and parts designated by the same reference numerals suffixed by a letter "A". This casing 100A is also constructed and sealed to meet a certain weather-proof standard such that the LED lamp is suitable for outdoor use.

The major difference lies in the cover 120A and the way in way it is engaged with the channel 110A to close the casing 100A.

The cover 120A is a rigid panel, being made of glass for example, and hence it cannot be twisted or bent without breaking or shattering. Each of its opposite edges 122A is formed, on its outer side, with a step 123A which runs along the entire length and results in a reduced thickness along the edge 122A.

As to the sealing method for sealing this casing 100A, the cover 120A has its both edges 122A engaged into the corresponding grooves 113A of the channel 110A first before the seal members 130A are used to seal the engagement between the edges 122A and the grooves 113A.

The steps of engaging the edges 122A into the respective grooves 113A correspond generally to the steps (iii) and (iv) described above, but the procedure is comparatively simpler, and both pairs of the edge 122A and grooves 113A are inter-engaged at the same time, i.e. combining steps (iii) and (iv) in general terms:

(iii) engaging one edge 122A of the cover 120A into the groove 113A of the channel 110A on same side, and (iv) engaging the other edge 122A of the cover 120A into the groove 113A of the channel 110A on the other side.

Figure 12:
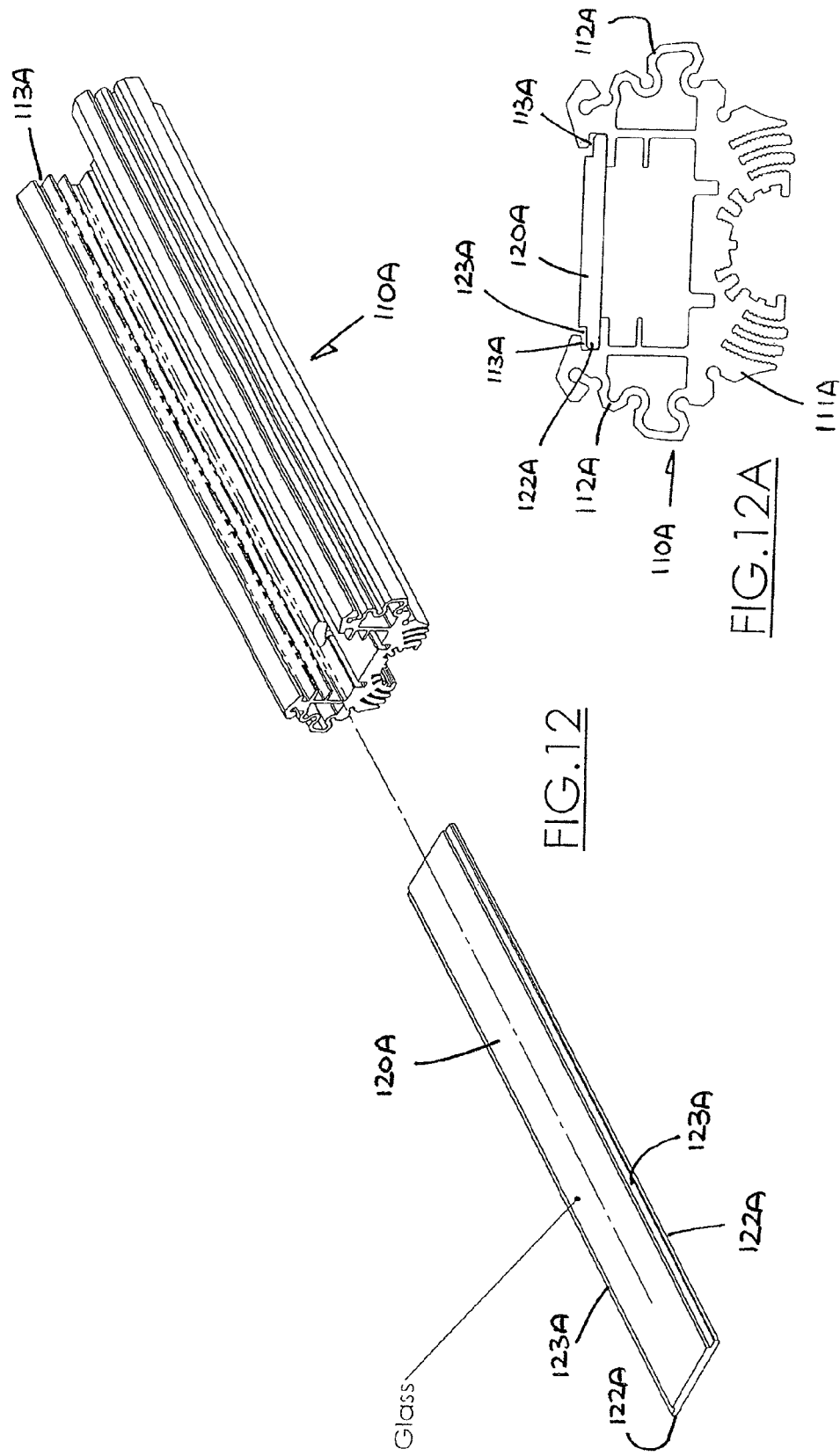
FIG. 12 is a perspective view of a second embodiment of an enclosure employing a method of sealing in accordance with the invention, showing a cover being engaged into a channel of the enclosure.

More specifically, the cover 120A is slid lengthwise into and along the channel 110A in the direction of the grooves 113A, with the edges 122A inserted at the near ends of the corresponding grooves 113A through to the far ends, as illustrated in FIGS. 12 and 12A. Such steps are a one-step operation simultaneously engaging both edges 122A into the respective grooves 113A.

The seal members 130A are subsequently employed, in steps similar to the steps (i) and (ii) described above but in the reverse order, as follows:

(ii) Stretching each of the two seal members 130A along its length to reduce its cross-sectional size, and (i) Placing the stretched seal members 130A laterally into the two grooves 113A on the side walls 112A of the channel 110A respectively, such that each seal member 130A extends along the length of the corresponding groove 113A.

Figure 13:
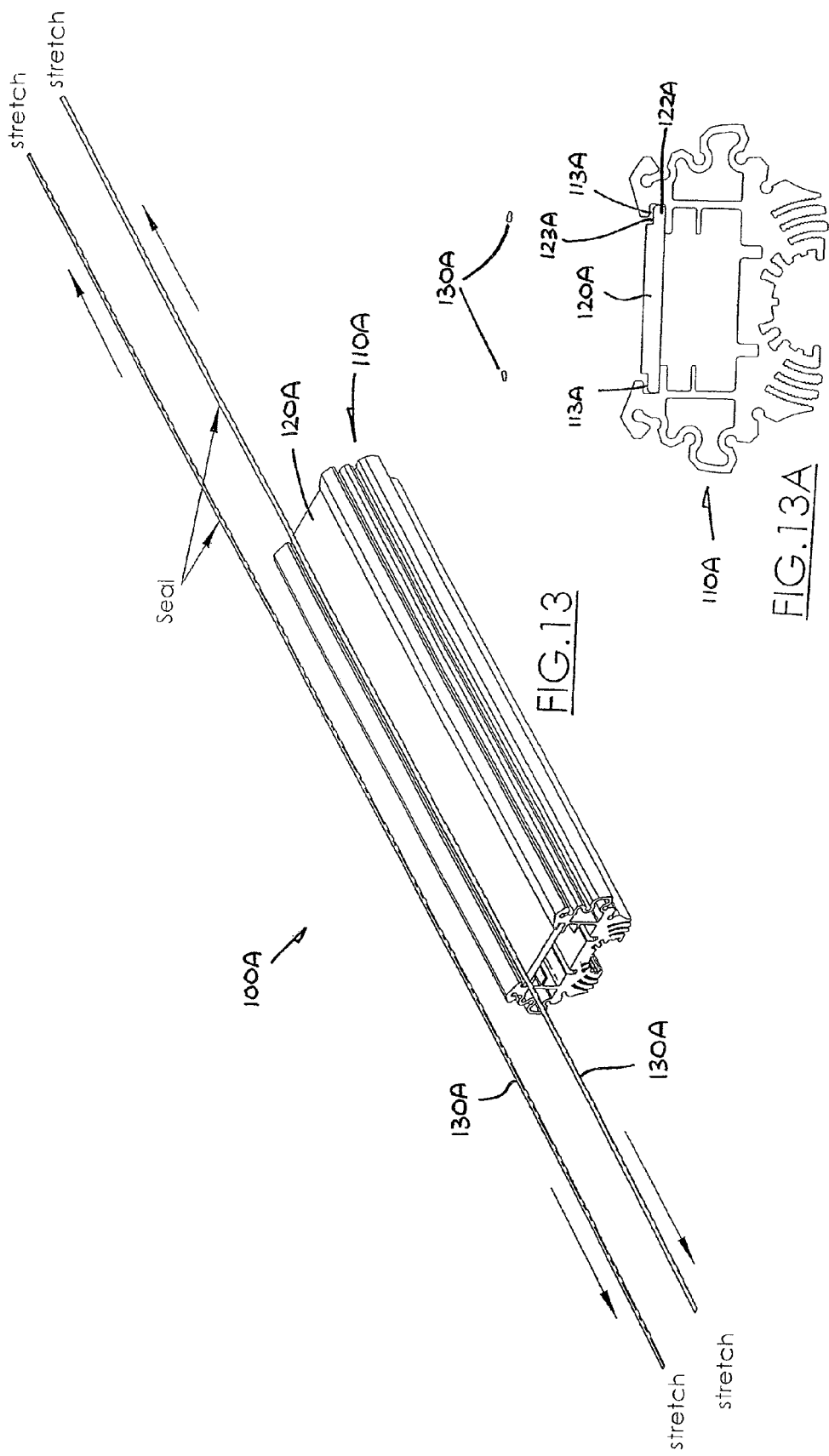
FIG. 13 is a perspective view of the channel and cover of FIG. 12A, showing two seal members stretched for use in the gaps between the cover and the channel.
Figure 14:
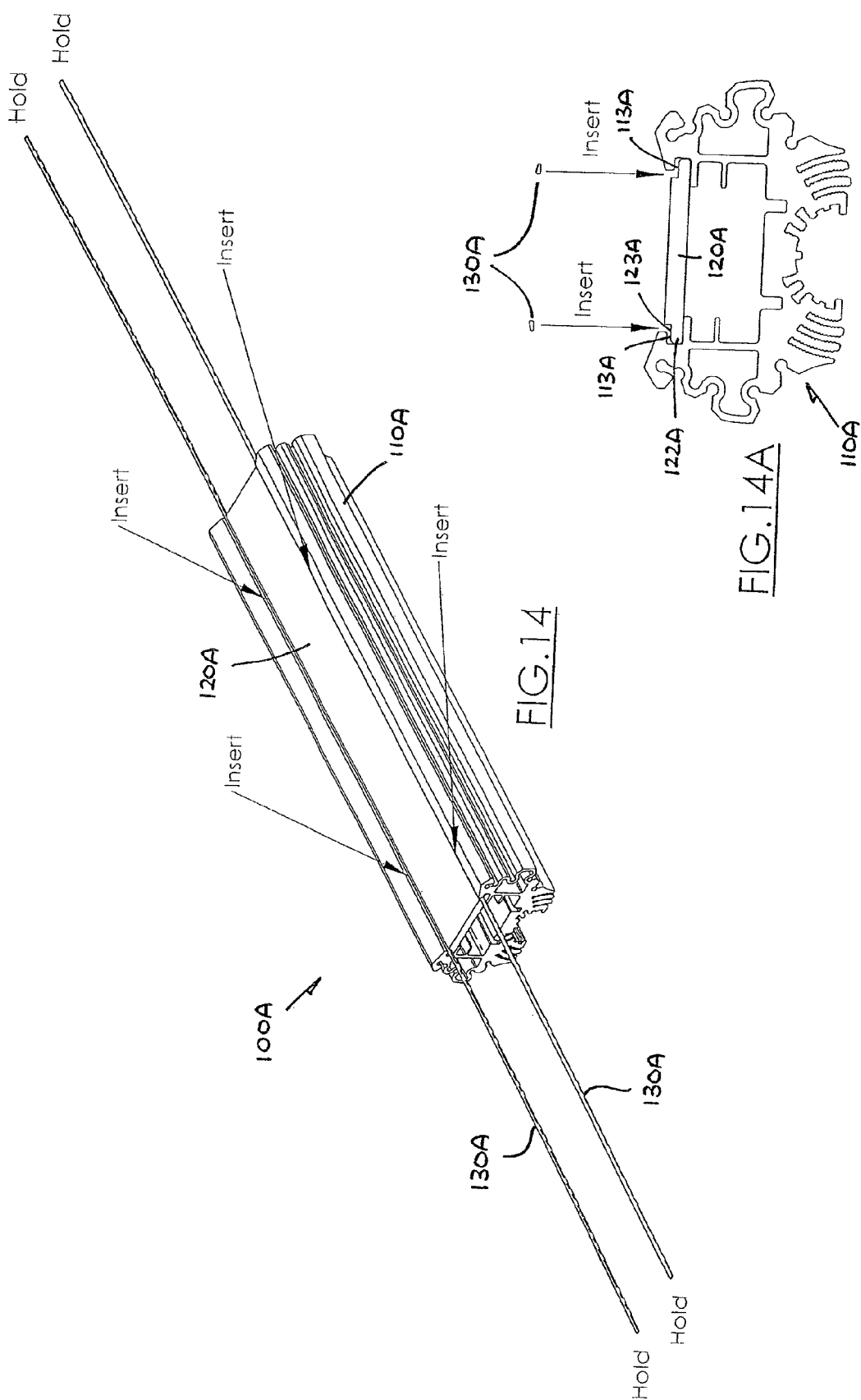
FIG. 14 is a perspective view of the assembly of FIG. 13, showing the two seal members being inserted into the gaps.

More specifically in step (i), because the cover 120A is already assembled with the channel 110A i.e. the edges 122A engaged within the corresponding grooves 113A, each seal member 130A should be stretched to become thinner and sufficiently thin, as illustrated in FIGS. 13 and 13A, the preceding step (ii), so that it can subsequently be inserted laterally into the restricted gap between the upper side of the groove 113A and the upper (outer) side of the edge 122A where the step 123A is present, as illustrated in FIGS. 14 and 14A.

Figure 15:
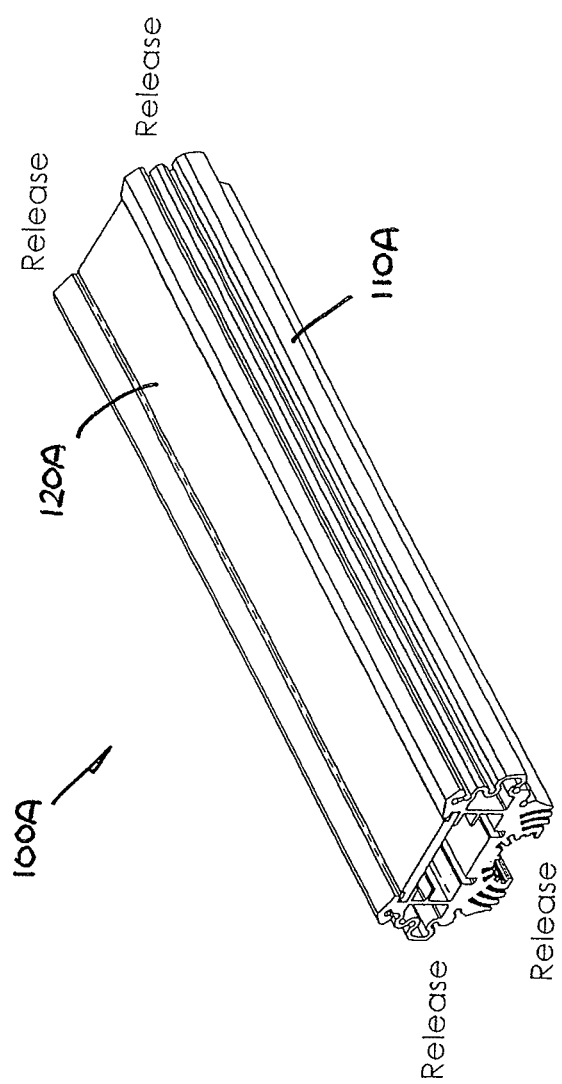
FIG. 15 is a perspective view of the assembly of FIG. 14, showing the two seal members released.

As a further step (v) illustrated in FIG. 15, each of the two seal members 130A is released from being stretched such that it expands in cross-sectional size and seals with the edge 122A and the groove 113A on the same, each side of the channel 110A and cover 120A.

The sealing engagement on each side is established in the restricted gap between the upper side of the groove 113A (which has two opposite sides and a base between them) and the upper side of the edge 122A where the step 123A is present. The seal member 130A expands and is squeezed between one (upper) side of the groove 113A and an adjacent (upper) side of the edge 122A of the cover 120.

The space in the groove 113A between the sides of the edge 122A and groove 113 is substantially fully occupied by the seal member 130A, which remains squeezed and compressed in the space confined to provide the intended degree or force of sealing, for example as required for outdoor weather-proof protection.

The step 123A serves to accommodate at least part of the thickness of the seal member 130A, and ideally the entire compressed thickness of the seal member 130A such that the seal member 130A is hidden from sight.

Figure 16:
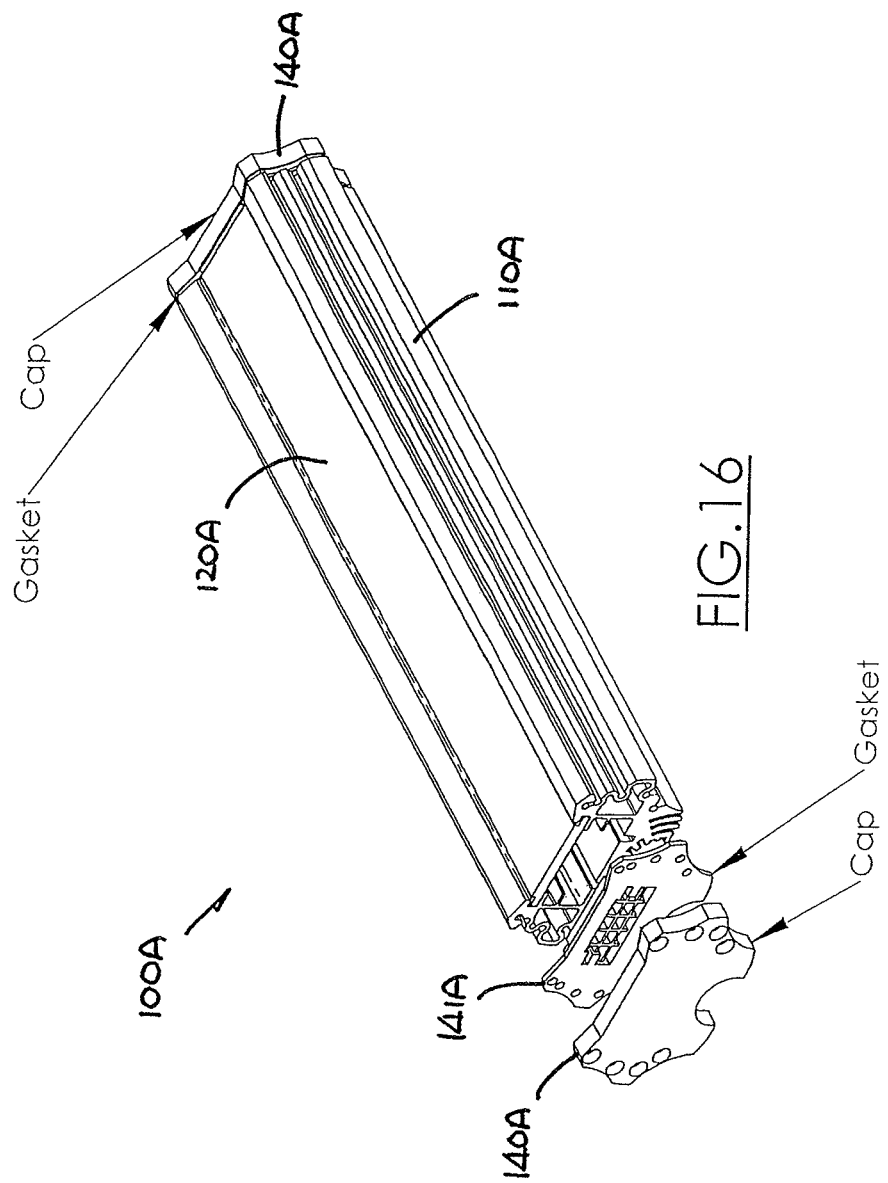
FIG. 16 is a perspective view of the assembly of FIG. 15, showing also an end plate with gasket sealing off each end of the assembled channel and cover.
Figure 17:
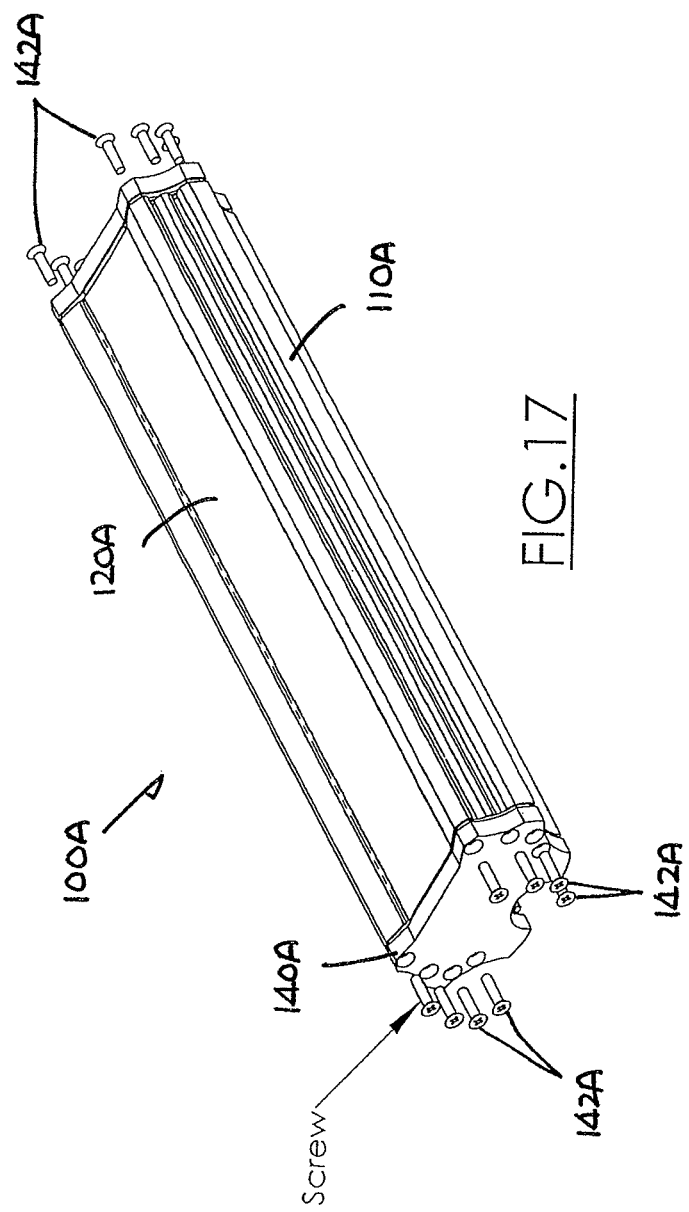
FIG. 17 is a perspective view of the assembly of FIG. 16, showing the end plate and gasket being secured by screws.
Figure 18:
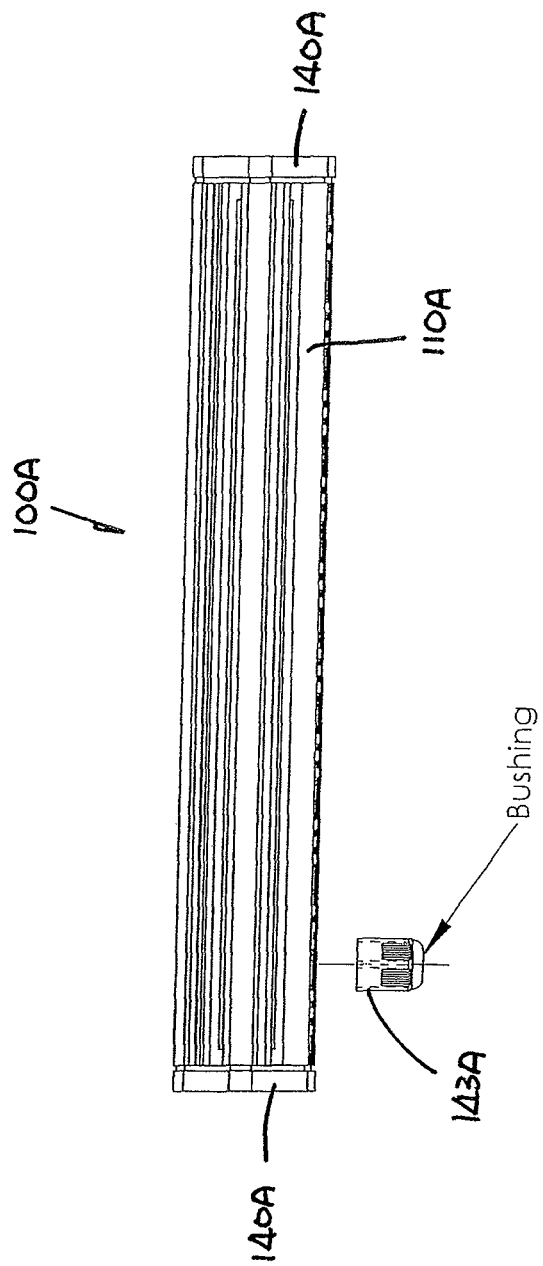
FIG. 18 is a side view of the assembly of FIG. 17, showing also a bushing being attached.

Each of opposite ends of the channel 110A with the cover 120A attached is finally sealed off by the respective end cap or plate 140A with gasket 141A secured by screws 142A, followed by the bushing 143A which is attached on the base 111A of the channel 110A for connection of an electrical cable to the drive circuit inside, as illustrated in FIGS. 16, 17 and 18.

The invention has been given by way of example only, and various other modifications of and/or alterations to the described embodiments may be made by persons skilled in the art without departing from the scope of the invention as specified in the appended claims. For example, the LEDs may be replaced by any other type of light sources such as incandescent light bulbs or fluorescent tubes.

The invention claimed is:

1. A method of forming a sealed enclosure comprising:
   providing a channel having a base, first and second walls opposite each other, and an opening between the first and second walls, opposite the base, wherein the first and second walls respectively include first and second longitudinal grooves opposite each other and extending longitudinally along the opening;
   providing a cover having first and second longitudinal edges for sealing to the channel;
   providing first and second elongate sealing members of a resilient elastic material;
   tensioning the first and second elongate sealing members longitudinally, whereby cross-sectional area of the first and second sealing members is reduced by the tensioning;
   placing the first and second sealing members, while tensioned, into the first and second grooves, respectively, in directions transverse to the first and second grooves;
   inserting the first and second edges of the cover into the first and second grooves, in directions transverse to the first and second grooves, compressing the first and second elongate sealing members between the first and second walls, within the first and second grooves, and the first and second edges of the cover, respectively; and
   releasing the tensioning of the first and second elongate sealing members, whereby the cover is sealed to the channel.

2. The method as claimed in claim 1, wherein the cover is deformable and including deforming the cover to insert the first and second edges of the cover into the first and second grooves.

3. A method of forming a sealed enclosure comprising:
   providing a channel having a base, first and second walls opposite each other, and an opening between the first and second walls, opposite the base, wherein the first and second walls respectively include first and second longitudinal grooves opposite each other and extending longitudinally along the opening;
   providing a cover having first and second longitudinal edges for sealing to the channel;
   inserting the first and second edges of the cover into the first and second grooves, in a direction generally parallel to the first and second grooves;
   providing first and second elongate sealing members of a resilient elastic material;
   tensioning the first and second elongate sealing members longitudinally, whereby cross-sectional area of the first and second sealing members is reduced by the tensioning;
   placing the first and second sealing members, while tensioned, onto the cover and into the first and second grooves, respectively, in directions transverse to the first and second grooves, thereby placing the first and second elongate sealing members between the first and second walls, within the first and second grooves, and the first and second edges of the cover, respectively; and
   releasing the tensioning of the first and second elongate sealing members, whereby the cover is sealed to the channel.

4. The method as claimed in claim 3, wherein the first and second edges of the cover include respective first and second steps, where thickness of the cover is relatively reduced, for accommodating at least part of the first and second elongate sealing members.

5. The method as claimed in claim 3, wherein the cover is rigid and inserting the cover in the first and second grooves comprises sliding the cover along the channel with the first and second edges respectively within the first and second grooves.

* * * * *